(12) United States Patent
Ide et al.

(10) Patent No.: US 8,437,107 B2
(45) Date of Patent: May 7, 2013

(54) MAGNETIC COUPLING TYPE ISOLATOR

(75) Inventors: Yosuke Ide, Niigata-ken (JP);
Masamichi Saito, Niigata-ken (JP);
Akira Takahashi, Niigata-ken (JP);
Tsuyoshi Nojima, Niigata-ken (JP);
Yoshihiro Nishiyama, Niigata-ken (JP);
Hidekazu Kobayashi, Niigata-ken (JP);
Kenji Ichinohe, Niigata-ken (JP); Naoki Sakatsume, Niigata-ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 642 days.

(21) Appl. No.: 12/754,509

(22) Filed: Apr. 5, 2010

(65) Prior Publication Data

US 2010/0270865 A1 Oct. 28, 2010

(30) Foreign Application Priority Data

Apr. 28, 2009 (JP) ................................. 2009-109610

(51) Int. Cl.
*G11B 5/39* (2006.01)

(52) U.S. Cl.
USPC ....................................................... 360/324.2

(58) Field of Classification Search ................ 360/324.2
See application file for complete search history.

(56) References Cited

U.S. PATENT DOCUMENTS 7,557,562 B2 * 7/2009 Myers et al. .............. 324/117 R

FOREIGN PATENT DOCUMENTS

| JP | 2000-516714 | 12/2000 |
|---|---|---|
| JP | 2003-526083 | 9/2003 |
| WO | 98/07165 | 2/1998 |
| WO | 99/45405 | 9/1999 |

* cited by examiner

*Primary Examiner* — Mark Blouin
(74) *Attorney, Agent, or Firm* — Beyer Law Group LLP

(57) ABSTRACT

A magnetic coupling type isolator includes: a magnetic field generator for generating an external magnetic field by an input signal; a magnetoresistive element for detecting the external magnetic field and converting the detected magnetic field into an electric signal, the magnetoresistive element being electrically insulated from the magnetic field generator and positioned in a location capable of being magnetically coupled so as to be overlapped with the magnetic field generator as seen in a top plan view; and first and second shield films overlapped with the magnetic field generator and the magnetoresistive element as seen in a top plan view, wherein a distance between the magnetoresistive element and the second shield film is set to 8 to 100 μm.

5 Claims, 7 Drawing Sheets

MAGNETIC COUPLING TYPE ISOLATOR

CROSS REFERENCE TO RELATED APPLICATION

The present invention contains subject matter related to Japanese Patent Application JP 2009-109610 filed in the Japanese Patent Office on Apr. 28, 2009, the entire contents of which being incorporated herein by reference.

BACKGROUND

1. Technical Field

The present invention relates to a magnetic coupling type isolator having a magnetic field generator and a magnetoresistive element such as a TMR (tunneling magnetoresistance) element, a CIP-GMR (current-in-plane giant magnetoresistance) element, and CPP-GMR (current perpendicular-to-the-plane) element.

2. Related Art

In an electronic circuit, for example, if a portion where a large current flows and a portion where a signal is transmitted are approximated to each other, the portion where a large current flows may influence signal transmission. For this reason, a circuit element for electrically separating the portion where a large current flows from the portion where a signal transmission is performed is necessary. Such a circuit element includes an optical isolator using a photo-coupler. The optical isolator includes a combination of a light sensing element and a light emitting element and has a function of transmitting signals by converting electricity into light and vice versa.

Meanwhile, a magnetic coupling type isolator capable of providing further miniaturization and lower power consumption compared to the optical isolator has been developed. For example, PCT Japanese Translation Patent Publication Nos. 2000-516714 and 2003-526083 disclose a magnetic coupling type isolator having a magnetic field generator for converting an input signal into a magnetic field and a magnetoresistive element for detecting the external magnetic field generated by the magnetic field generator and converting it into the electric signal. Here, the magnetoresistive element includes a Hall element, an AMR (anisotropic magnetoresistive) element, or a GMR (giant magnetoresistive) element.

In the magnetic coupling type isolators disclosed in PCT Japanese Translation Patent Publication Nos. 2000-516714 and 2003-526083, a shield capability for unnecessary magnetic fields from an external environment is obtained by providing a shield film in an upper portion of a coil where the magnetic fields are generated. This shield film also functions as a concentrator of the magnetic fields applied to the magnetoresistive element from the coil.

However, in the magnetic coupling type isolators disclosed in PCT Japanese Translation Patent Publication Nos. 2000-516714 and 2003-526083, the shield film is disposed only in the coil. Therefore, it may be impossible to obtain a sufficient tolerance to the external magnetic fields or an EMS (electro magnetic susceptibility).

SUMMARY

An advantage of some aspects of the invention is to provide a magnetic coupling type isolator enabled to obtain a sufficient tolerance to an external magnetic field or an EMS.

According to an aspect of the invention, there is provided a magnetic coupling type isolator including: a magnetic field generator for generating an external magnetic field by an input signal; a magnetoresistive element for detecting the external magnetic field and converting the detected magnetic field into an electric signal, the magnetoresistive element being electrically insulated from the magnetic field generator and positioned in a location capable of being magnetically coupled so as to be overlapped with the magnetic field generator as seen in a top plan view; and first and second shield films overlapped with the magnetic field generator and the magnetoresistive element as seen in a top plan view, wherein a distance between the magnetoresistive element and the second shield film is set to 8 to 100 µm.

In this configuration, since the first and second shield films are overlapped with the magnetic field generator and the magnetoresistive element as seen in a top plan view, it is possible to obtain a sufficient tolerance to an external magnetic field or an EMS. Since the distance between the magnetoresistive element and the second shield film is set to 8 to 100 µm, it is possible to suppress attenuation in the magnetic field applied from the magnetic field generator to the magnetoresistive element.

In the magnetic coupling type isolator according to an embodiment of the present invention, it is preferable that the magnetic field generator includes first and second magnetic field generators by which the external magnetic field is generated in an opposite direction to each other, wherein the magnetoresistive element includes a magnetoresistive element disposed to face the first magnetic field generator and a magnetoresistive element disposed to face the second magnetic field generator, wherein each of the magnetoresistive elements is included in the same layer, and wherein the magnetoresistive element disposed to face the first magnetic field generator and the magnetoresistive element disposed to face the second magnetic field generator constitute a bridge circuit.

In the magnetic coupling type isolator according to an embodiment of the present invention, it is preferable that the first shield film has a function of enhancing the magnetic field applied from the magnetic field generator to the bridge circuit.

In the magnetic coupling type isolator according to an embodiment of the present invention, it is preferable that the first and/or second shield films are made of a high magnetic permeability material.

In the magnetic coupling type isolator according to an embodiment of the present invention, it is preferable that the first and/or second shield films are point-symmetrical as seen in a top plan view, and symmetrical centers of the first and/or second shield films match with each other.

A magnetic coupling type isolator according to the embodiment of the present invention includes a magnetic field generator for generating an external magnetic field by an input signal, a magnetoresistive element for detecting the external magnetic field and converting the detected magnetic field into an electric signal, the magnetoresistive element being electrically insulated from the magnetic field generator and positioned in a location capable of being magnetically coupled so as to be overlapped with the magnetic field generator as seen in a top plan view, and first and second shield films overlapped with the magnetic field generator and the magnetoresistive element as seen in a top plan view, wherein a distance between the magnetoresistive element and the second shield film is set to 8 to 100 µm. Accordingly, it is possible to suppress attenuation in the magnetic field applied from the magnetic field generator to the magnetoresistive element.

DESCRIPTION OF EXEMPLARY EMBODIMENTS

Hereinafter, embodiments of the invention will be described in detail with reference to the accompanying drawings.

Figure 1:
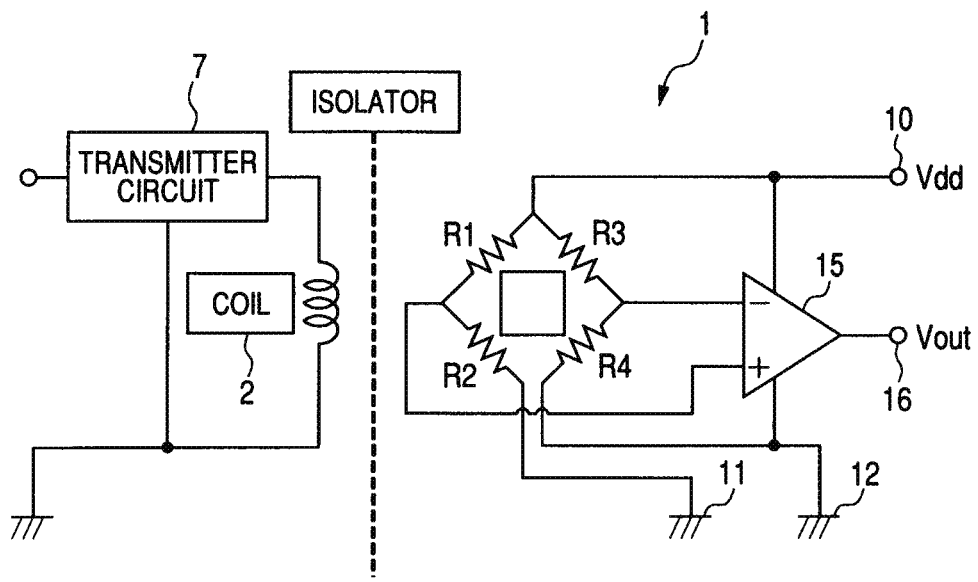
FIG. 1 shows a circuit diagram of an entire configuration of a magnetic coupling type isolator according to an embodiment of the invention.
Figure 2:
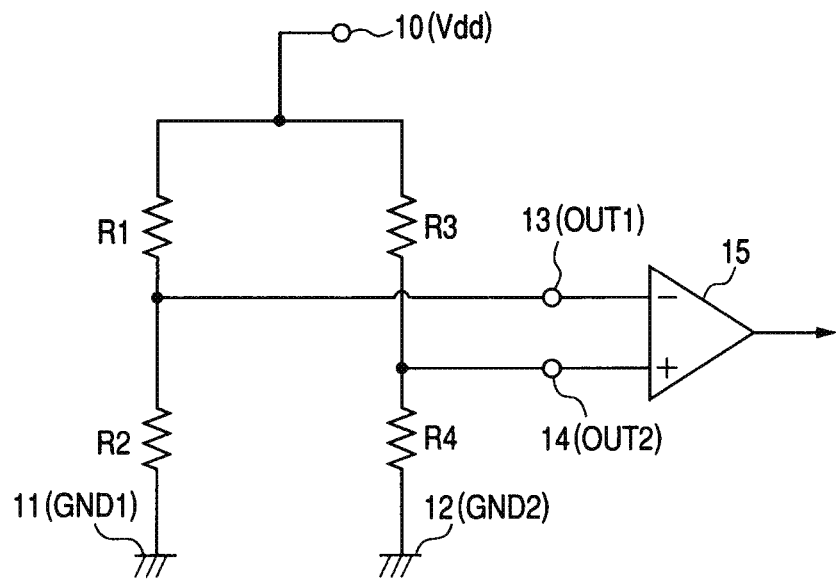
FIG. 2 shows a circuit diagram of a bridge circuit including magnetoresistive elements R1 to R4.
Figure 3:
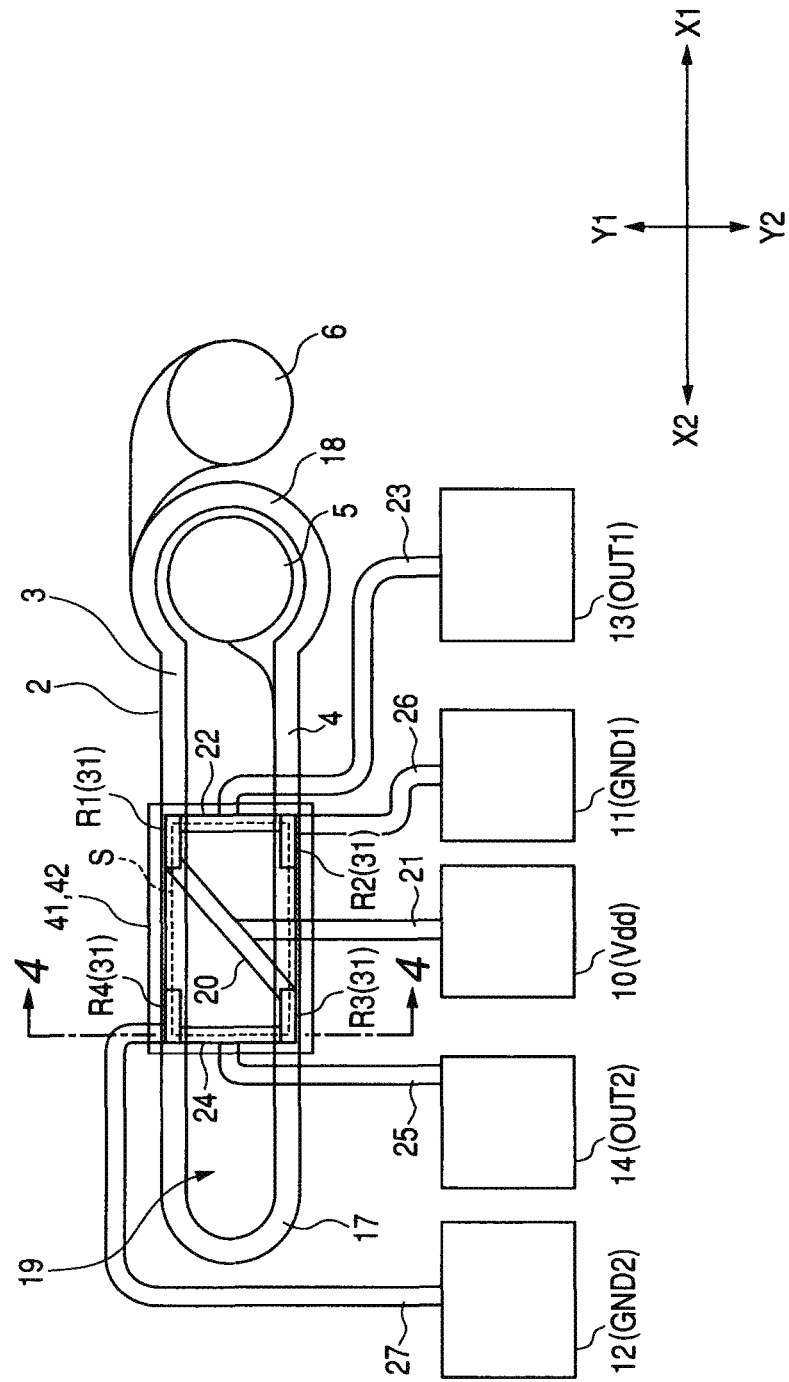
FIG. 3 shows a partial plan diagram of a magnetic coupling type isolator according to an embodiment of the invention.
Figure 4:
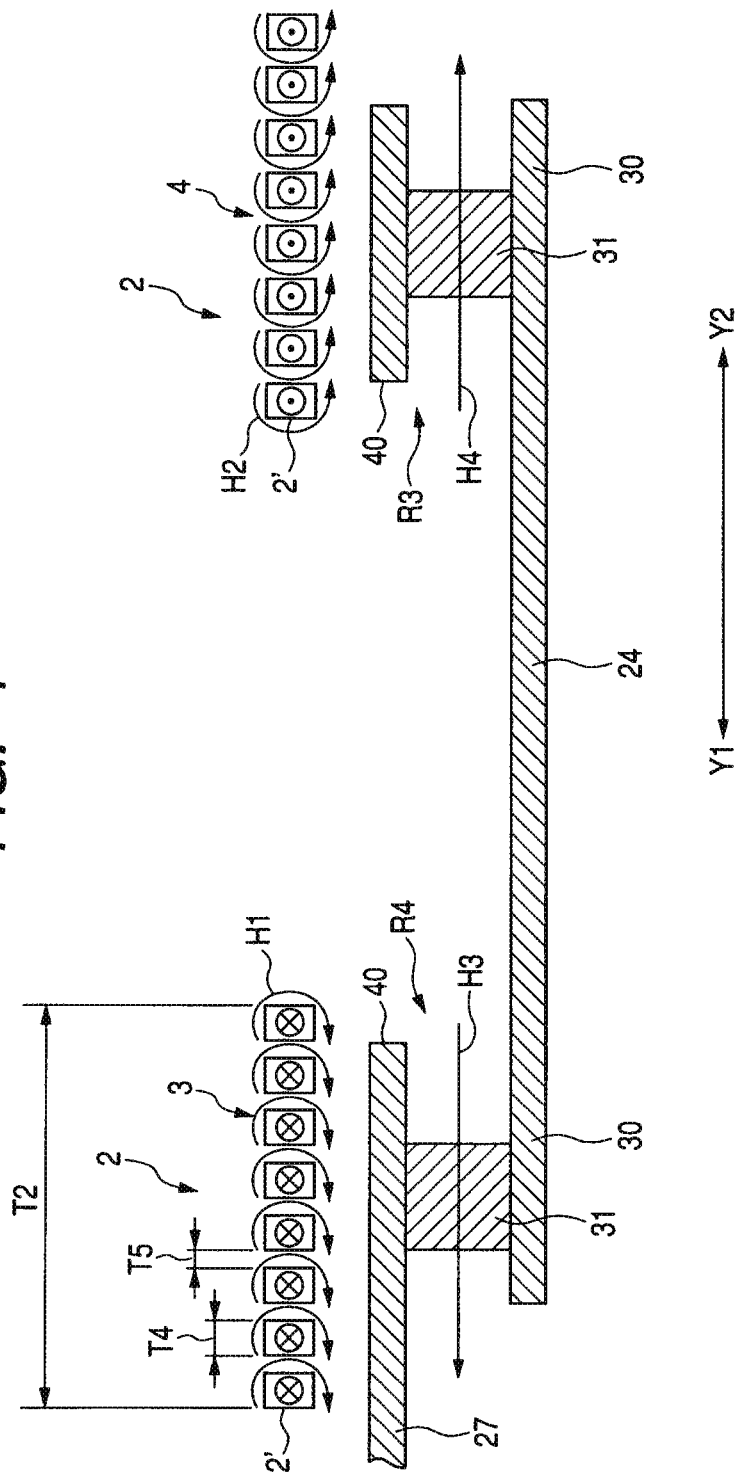
FIG. 4 shows a partially cross-sectional diagram viewed from an arrow direction and cut away in a thickness direction along a line A-A of FIG. 3.

FIG. 1 is a circuit diagram illustrating an entire configuration of a magnetic coupling type isolator (or magnetic coupler) according to an embodiment of the invention. FIG. 2 is a circuit diagram illustrating a bridge circuit including magnetoresistive elements R1 to R4. FIG. 3 is a partial plan diagram illustrating a magnetic coupling type isolator according to an embodiment of the invention. FIG. 4 is a partially cross-sectional diagram viewed from an arrow direction and cut away in a thickness direction along a line A-A of FIG. 3. In addition, while the insulation layer is not shown, and only the inner and outer edges of the coil 2 are shown in FIG. 3, the magnetoresistive elements R1 to R4 underlying the coil 2 are shown by transparency.

As shown in FIG. 1, the magnetic coupling type isolator 1 includes a coil 2 as a magnetic field generator for generating an external magnetic field by the input signal and magnetoresistive elements R1 to R4 for detecting the external magnetic field and converting it into an electric signal. While the coil 2 and each of the magnetoresistive elements R1 to R4 are electrically insulated by an insulation layer (not shown), they are spaced at an interval capable of obtaining a magnetic coupling. In other words, the coil 2 and the magnetoresistive elements R1 to R4 are electrically insulated, spaced at an interval capable of obtaining a magnetic coupling, and overlapped with each other as seen in a top plan view.

In FIG. 1, a signal processing circuit (IC) such as a differential amplifier 15 or an external output terminal 16 is included in the magnetic coupling type isolator 1. However, the magnetic coupling type isolator 1 may include a coil 2, magnetoresistive elements R1 to R4, and terminals 10 to 14 shown in FIG. 3 without the signal processing circuit (IC). In this case, it is necessary to electrically connect the magnetic coupling type isolator 1 to the signal processing circuit (IC) of the electronic device side.

As shown in FIG. 3, the coil 2 includes a first magnetic field generator 3 and a second magnetic field generator 4 extending along a direction X1-X2. The first and second magnetic field generators 3 and 4 face each other with an interval along a direction Y1-Y2. The first and second magnetic field generators 3 and 4 are connected to each other by interconnections 17 and 18. The interconnections 17 and 18 are curved in shape, but not limited thereto. There is a space 19 surrounded by the first magnetic field generator 3, the second magnetic field generator 4, and interconnections 17 and 18.

As shown in FIG. 4, the coil 2 is formed by winding a plurality of coil pieces 2', having a width T4, spaced at a predetermined interval T5. Therefore, as shown in FIG. 4, the first and second magnetic field generators 3 and 4 include a plurality of coil pieces 2' arranged side by side along a direction Y1-Y2.

Two electrode pads 5 and 6 are connected to the coil 2. The electrode pads 5 and 6 have a circular shape, but are not limited thereto. In addition, the coil 2 is connected to the transmitter circuit 7 through the electrode pads 5 and 6 as shown in FIG. 1. When the electric current flows based on the input signal from the transmitter circuit 7, an external magnetic field is generated from the coil 2. As shown in FIG. 4, the current flowing through the coil piece 2' of the first magnetic field generator 3 is anti-parallel to the current flowing through the coil piece 2' of the second magnetic field generator 4. The external magnetic field H1 generated by the coil piece 2' of the first magnetic field generator 3 is directed adversely to the external magnetic field H2 generated by the coil piece 2' of the second magnetic field generator 4. As shown in FIGS. 3 and 4, under (or over) the first and second magnetic field generators 3 and 4, the magnetoresistive elements R1 to R4 are arranged to face each other by interposing an insulation layer (not shown). The external magnetic field H3 applied by the first magnetic field generator 3 to the first and fourth magnetoresistive elements R1 and R4 arranged to face the first magnetic field generator 3 is anti-parallel to the external magnetic field H4 applied by the second magnetic field generator 4 to the second and third magnetoresistive elements R2 and R3 arranged to face the second magnetic field generator 4.

As shown in FIG. 2, the first magnetoresistive element R1 is connected in series to the second magnetoresistive element R2, and the third magnetoresistive element R3 is connected in series to the fourth magnetoresistive element R4. In addition, the first and third magnetoresistive elements R1 and R3 are connected to the input terminal (input pad) 10. According to an embodiment of the invention, the number of input terminals 10 is one. In addition, the second and fourth magnetoresistive elements R2 and R4 are connected to ground terminals (or ground pads) 11 and 12, respectively. Therefore, according to an embodiment of the invention, the number of ground terminals 11 and 12 is two.

As shown in FIG. 2, the first output terminal 13 (or first output pad OUT1) is connected between the first and second magnetoresistive elements R1 and R2. The second output terminal 14 (or second output pad OUT2) is connected between the third and fourth magnetoresistive elements R3 and R4. In addition, as shown in FIGS. 1 and 2, the output sides of the first and second output terminals 13 and 14 are connected to the differential amplifier 15. As shown in FIG. 1, the output side of the differential amplifier 15 is connected to the external output terminal 16.

As shown in FIG. 3, the first magnetoresistive element R1 arranged to face the first magnetic field generator 3 of the coil 2 is disposed in the X1 side, and the fourth magnetoresistive element R4 is disposed in the X2 side. In addition, the second magnetoresistive element R2 arranged to face the second magnetic field generator 4 of the coil 2 is disposed in the X1 side, and the third magnetoresistive element R3 is disposed in the X2 side.

As shown in FIG. 3, the first wiring pattern 20 is connected between the first and third magnetoresistive elements R1 and R3. The first wiring pattern 20 is disposed within a boxed area S rectilinearly enclosed by each element R1 to R4 as seen in a top plan view. The first wiring pattern 20 is slanted against the directions X1-X2 and Y1-Y2. The second wiring pattern 21 is branched from the first wiring pattern 20. The second wiring pattern 21 extends from the inner side of the boxed area S to the outer side of the boxed area S and is connected to the input terminal 10.

As shown in FIG. 3, the third wiring pattern 22 is connected between the first and second magnetoresistive elements R1 and R2. The third wiring pattern 22 extends along a direction Y1-Y2. Furthermore, the fourth wiring pattern 23 is branched from the third wiring pattern 22 to the outer side of the boxed area S. The fourth wiring pattern 23 is connected to the first output terminal 13.

As shown in FIG. 3, the fifth wiring pattern 24 is connected between the third and fourth magnetoresistive elements R3 and R4. The fifth wiring pattern 24 extends along a direction Y1-Y2. Furthermore, the sixth wiring pattern 25 is branched from the fifth wiring pattern 24 to the outer side of the boxed area S. The sixth wiring pattern 25 is connected to the second output terminal 14.

Furthermore, as shown in FIG. 3, the seventh wiring pattern 26 is connected between the second magnetoresistive element R2 and the first ground terminal 11. In addition, the eighth wiring pattern 27 is connected between the fourth magnetoresistive element R4 and the second ground terminal 12.

As shown in FIG. 3, the terminals 10 to 14 are arranged in a line with a predetermined interval along a direction X1-X2. Therefore, a wiring (i.e., electrical connection) to the signal processing circuit (IC) side can be simplified. In the center of the terminals 10 to 14, the input terminal 10 is solely disposed. Such an arrangement allows the wiring patterns to be drawn so as not to overlap with one another as seen in a top plan view.

However, the shapes of wiring patterns are not limited to those shown in FIG. 3. The wiring patterns may be overlapped with one another as seen in a top plan view. Instead of those shown in FIG. 3, the ground terminal may be placed in the position of the input terminal 10, and the input terminal may be placed in the position of the ground terminal 11, 12. In this case, the number of ground terminals is one, and the number of input terminals is two.

As shown in FIG. 3, the upper shield film (or first shield film) 41 and the lower shield film (or second shield film) 42 are overlapped with the coil 2 functioning as the magnetic field generator and the magnetoresistive elements R1 to R4 as seen in a top plan view.

Figure 5:
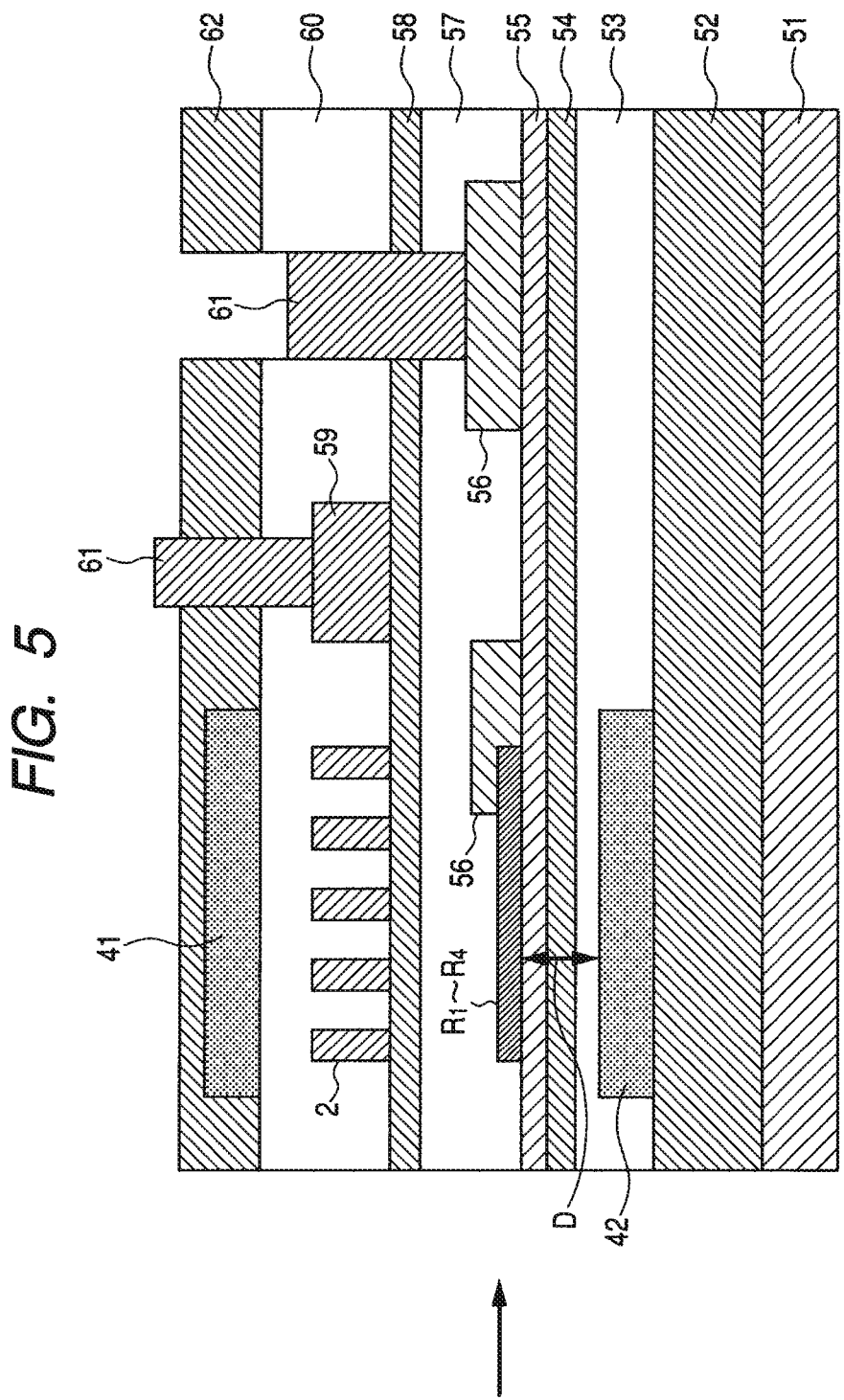
FIG. 5 shows a partially cross-sectional diagram of a magnetic coupling type isolator according to an embodiment of the invention.

FIG. 5 is a partially cross-sectional diagram illustrating a magnetic coupling type isolator according to an embodiment of the invention. In the magnetic coupling type isolator shown in FIG. 5, the silicon oxide film 52 functioning as the insulation layer is formed on the silicon substrate 51. The silicon oxide film 52 may include a silicon oxide film formed by thermal oxidation or a silicon oxide film formed by CVD (chemical vapor deposition).

A lower shield film 42 is formed under an area of the coil 2, i.e., in a thickness direction, (in a position overlapped with the coil 2 and the magnetoresistive elements R1 to R4 as seen in a top plan view), at a predetermined position on the silicon oxide film 52. A material of the lower shield film 42 includes a high magnetic permeability material such as an amorphous magnetic material, a permalloy-based magnetic material, or an iron-based microcrystalline material. The thickness of the lower shield film 42 is preferably set to 0.5 to 10 μm considering film stress. The lower shield film 42 may be formed by photolithography and etching after the aforementioned material is formed. Alternatively, the lower shield film 42 may be formed by photolithography and plating after a base material is formed.

On the silicon oxide film 52 where the lower shield film 42 is provided, a polyimide layer 53 as an insulation layer is formed. The polyimide layer 53 may be formed by coating a polyimide material and curing it.

On the polyimide layer 53, the silicon oxide film 54 and the aluminum oxide film 55 are sequentially formed. The silicon oxide film 54 and the aluminum oxide film 55 may be formed, for example, by sputtering or the like.

On the aluminum oxide film 55, the magnetoresistive elements R1 to R4 are formed. Each of the magnetoresistive elements R1 to R4 has the same layer configuration. Each of the magnetoresistive elements R1 to R4 is formed, for example, using the structure shown in FIG. 6.

Figure 6:
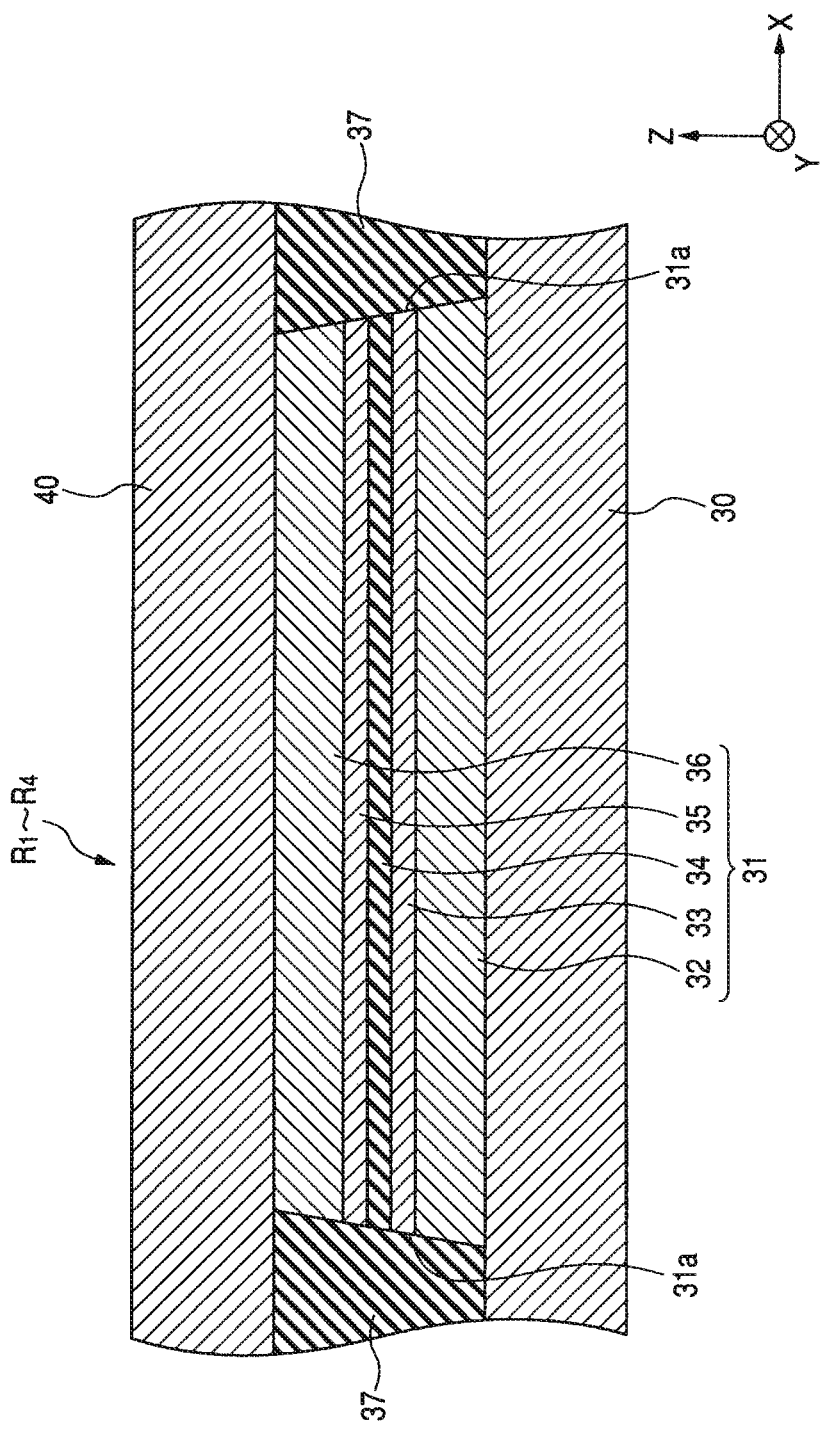
FIG. 6 shows a partially cross-sectional diagram of a TMR element included in a magnetic coupling type isolator according to an embodiment of the invention.

The reference numeral 30 shown in FIG. 6 is a lower electrode layer. A multilayer film 31 is provided on the lower electrode layer 30. The multilayer film 31 is formed by sequentially stacking an antiferromagnetic layer 32, a permanent magnetic layer 33, an insulation barrier layer 34, a free magnetic layer 35, and a protection layer 36 from the bottom. The multilayer film 31 may be formed by sequentially stacking a free magnetic layer 35, an insulation barrier layer 34, a permanent magnetic layer 33 and an antiferromagnetic layer 32 from the bottom.

The antiferromagnetic layer 32 is formed of, for example, an element a (including one or more elements selected from a group consisting of Pt, Pd, Ir, Rh, Ru, and Os) and an antiferromagnetic material containing Mn. A crystalline orientation layer for aligning crystalline orientations may be provided between the antiferromagnetic layer 32 and the lower electrode layer 30

The magnetization of the permanent magnetic layer 33 is fixed in a Y-direction due to an exchange coupling magnetic field Hex generated in an interface with the antiferromagnetic layer 32. Here, "fixed magnetization" means that the magnetization does not change at least with respect to the external magnetic field applied from the coil 2 to the magnetoresistive elements R1 to R4. In FIG. 6, while the permanent magnetic layer 33 is a single-layered structure containing CoFe or the like, it may be a stacked structure, and particularly, a ferrimagnetic stack structure including a magnetic layer, a nonmagnetic intermediate layer, or a magnetic layer is preferable because the magnetization fixation force of the permanent magnetic layer 33 can increase.

The insulation barrier layer 34 is formed on the permanent magnetic layer 33. The insulation barrier layer 34 is formed of, for example, titanium oxide (Ti—O) or magnesium oxide (Mg—O). The free magnetic layer 35 is formed on the insulation barrier layer 34. While the free magnetic layer 35 is a single-layered structure in FIG. 6, it may be a magnetic stack structure. While the free magnetic layer 35 is a single-layered structure containing NiFe, it is preferably a stack structure containing NiFe. The protection layer 36 formed of a nonmagnetic metallic material such as Ta is formed on the free magnetic layer 35.

Both side end surfaces 31a and 31a of the direction X1-X2 (i.e., X-direction) of the multilayer film 31 are formed to be slanted such that the width of the X-direction is gradually narrowed from the bottom to the top. However, they need be not slanted but may be vertically erected.

As shown in FIG. 6, the insulation layer 37 is formed across the side end surfaces 31a and 31a on the lower electrode layer 30. The insulation layer 37 is formed on an existing insulation material such as Al2O3 or SiO2. Furthermore, the upper electrode layer 40 is formed on the insulation layer 37 and the multilayer film 31.

Next, an output of a bridge circuit for the external magnetic field will be described. For example, if the magnetization of the permanent magnetic layers 33 of each magnetoresistive element R1 to R4 are fixed in the Y1 direction, and the external magnetic fields H3 and H4 shown in FIG. 4 are applied to the magnetoresistive elements R1 to R4, the magnetization of the free magnetic layers 35 of the first and fourth magnetoresistive elements R1 and R4 is oriented to a direction Y1. Therefore, the electric resistance values of the first and fourth magnetoresistive elements R1 and R4 are reduced. Meanwhile, the magnetization of the second and third magnetoresistive elements R2 and R3 is orientated to a direction Y2. Therefore, the electric resistance values of the second and third magnetoresistive elements R2 and R3 increase. As a result, the midpoint electric potential between the first and second magnetoresistive elements R1 and R2 and the midpoint electric potential between third and fourth magnetoresistive elements R3 and R4 change, so that a differential output can be obtained. As described above, in the magnetic coupling type isolator 1, the electric signal can be transferred from the coil 2 via the magnetoresistive elements R1 to R4.

According to an embodiment of the invention, all the magnetoresistive elements R1 to R4 are formed in the same layer structure. Here, the "layer structure" includes the magnetization orientation of the permanent magnetic layer 33 as well as a stack sequence or a material. As shown in FIG. 3, the first and fourth magnetoresistive elements R1 and R4 are disposed to face the first magnetic field generator 3 of the coil 2, and the second and third magnetoresistive elements R2 and R3 are disposed to face the second magnetic field generator 4. By connecting wires as shown in FIG. 3, a bridge circuit is configured by the magnetoresistive elements R1 to R4. Since all the magnetoresistive elements R1 to R4 are formed in the same layer structure according to an embodiment of the invention, it is easy to match the resistance values or temperature characteristics of all the magnetoresistive elements R1 to R4, and it is possible to appropriately and readily form each of the magnetoresistive elements R1 to R4. In addition, as shown in FIG. 3, it is possible to simply and appropriately configure the bridge circuit by arranging the magnetoresistive elements R1 to R4 and the coil 2.

The magnetoresistive elements R1 to R4 according to an embodiment of the invention are TMR (tunneling magnetoresistive) elements. Therefore, the electrode layers 30 and 40 underlies and overlies the multilayer film 31. In addition, the electric current flows in a vertical direction with respect to the film surfaces of each layer of the multilayer film 31. Such a magnetoresistive element is referred to as a CPP (current perpendicular to the plane) type element. The CPP type element includes the CPP-GMR element in addition to the TMR element. In the CPP-GMR element, a nonmagnetic conductive layer such as Cu is used instead of the insulation barrier layer 34 shown in FIG. 6.

As shown in FIG. 4, the wiring pattern 24 is formed as a single body with the lower electrode layer 30. While the wiring pattern 24 may be formed separately from the lower electrode layer 30, the wiring pattern 24 and the lower electrode layer 30 are electrically connected to each other even in this case. The wiring pattern 27 is integrated with the upper electrode layer 40 as a single body. While the wiring pattern 27 may be formed separately from the upper electrode layer 40, the wiring pattern 27 and the upper electrode layer 40 are electrically connected to each other even in this case. As described above, since the TMR element includes the multilayer film 31 and the electrode layers 30 and 40 underlying and overlying the multilayer film 31, the wiring pattern connected to the electrode layers 30 and 40 is formed in a plurality of layers.

In the shape shown in FIG. 3, while the wiring patterns 20, 21, 26, 27 are formed in an upper layer, the wiring patterns 22, 23, 24, and 25 are formed in a lower layer, and vice versa.

Returning to FIG. 5, the electrode 56 is formed on the aluminum oxide film 55 so as to be electrically connected to the upper electrode layer 40 of the magnetoresistive elements R1 to R4. The electrode 56 is formed in an outer side with respect to the magnetoresistive elements R1 to R4 so as to be electrically connected to the pad which will be described later. The electrode 56 may be formed by photolithography and etching after an electrode material is deposited.

On the aluminum oxide film 55 where the magnetoresistive elements R1 to R4 and the electrode 56 are formed, a polyimide layer 57 as an insulation layer is formed. The polyimide layer 57 may be formed by coating a polyimide material and curing it.

On the polyimide layer 57, the silicon oxide film 58 is formed. The silicon oxide film 58 may be formed, for example, by sputtering or the like.

The coil 2 is formed on the silicon oxide film 58. The coil 2 may be formed by photolithography and etching after the coil material is deposited. Alternatively, the coil 2 may be formed by photolithography and plating after a base material is deposited. In addition, the coil electrode 59 is formed on the silicon oxide film 58. The coil electrode 59 may be formed by photolithography and etching after the electrode material is deposited. Alternatively, the coil electrode 59 may be formed by photolithography and plating after a base material is deposited.

The polyimide layer 60 as the insulation layer is formed on the silicon oxide film 58 including the coil 2 and the coil electrode 59. The polyimide layer 60 may be formed by coating a polyimide material and curing it.

The upper shield film 41 is formed on the polyimide layer 60 at a predetermined position, i.e., in the thickness direction, over the coil 2 (the position overlapped with the coil 2 and the magnetoresistive elements R1 to R4 as seen in a top plan view). The upper shield film 41 may be formed of a high magnetic permeability material such as an amorphous magnetic material, a permalloy-based magnetic material, or an iron-based microcrystalline material. The thickness of the upper shield film 41 is preferably set to 0.5 to 10 μm considering film stress. The upper shield film 41 may be formed by photolithography and etching after the aforementioned material is deposited. Alternatively, the upper shield film 41 may be formed by photolithography and plating after a base material is deposited.

The silicon oxide film 62 is formed as an overcoat layer on the polyimide layer 60 including the upper shield film 41. A contact hole is formed in the areas of the electrode 56 for the pad and the coil electrode 59 of the silicon oxide film 62, the polyimide layers 57 and 60, and the silicon oxide film 58, and the pad 61 is formed within the contact hole. As a result, the pad 61 and the coil electrode 59 are electrically connected to each other, and the pad 61 and the electrode 56 are electrically connected to each other.

In the configuration shown in FIG. 5, the silicon oxide films 54 and 58 may be dispensed with.

As is apparent from FIG. 5, the magnetic coupling type isolator according to an embodiment of the invention includes the upper and lower shield films 41 and 42 overlapped with the coil 2 and the magnetoresistive elements R1 to R4. As described above, since the upper and lower shield films 41 and 42 are provided around the magnetoresistive elements R1 to R4, it is possible to obtain a sufficient tolerance to an external magnetic field or an EMS.

It is preferable that the upper shield film has a function of enhancing the magnetic field received by the bridge circuit including the coil 2 and the magnetoresistive elements R1 to R4. In addition, it is preferable that the upper and/or lower shield films 41 and/or 42 have a point-symmetric shape as seen in a top plan view, and their symmetric centers match with one another. In this configuration, it is possible to alleviate the difference of the midpoint electric potentials by more uniformly providing the magnitude of the magnetic field received by the magnetoresistive elements R1 to R4.

The effect of the magnetic coupling type isolator having the aforementioned configuration will be described.

Figure 7:
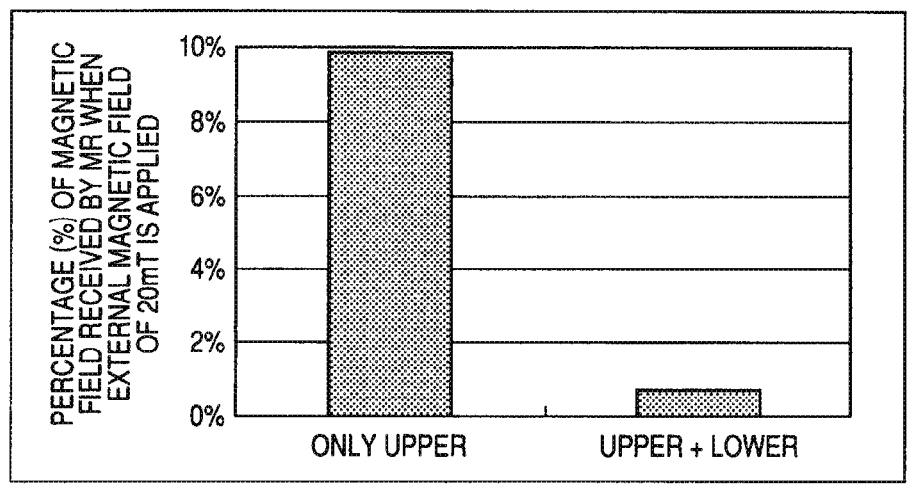
FIG. 7 shows a relationship between a configuration of a shield film of a magnetic coupling type isolator and a percentage of the magnetic field received by the magnetoresistive element when an external magnetic field is applied.

For the configuration shown in FIG. 5, i.e., the magnetic coupling type isolator including upper and lower shield films 41 and 42 provided around the magnetoresistive elements R1 to R4 (the upper and lower shield films 41 and 42 have a square shape of 200 μm×200 μm), the percentage of the magnetic field received by the magnetoresistive element was examined by applying an external magnetic field of 20 mT in a direction of the arrow of FIG. 5 (i.e., the horizontal direction with respect to the magnetoresistive elements R1 to R4). The result thereof is shown in FIG. 7. The result shows that the percentage of the magnetic field received by the magnetoresistive element when the external magnetic field is applied is nearly zero, which implies an excellent shield effect. For comparison purposes, another magnetic coupling type isolator having the same configuration as that shown in FIG. 5 except that only the upper shield film 41 is provided without the lower shield film 42 was manufactured. Similarly, the percentage of the magnetic field received by the magnetoresistive element when the external magnetic field is applied was examined. The result is also shown in FIG. 7.

As is apparent from FIG. 7, in the magnetic coupling type isolator having the upper and lower shield films 41 and 42 provided around the magnetoresistive elements R1 to R4, the percentage of the magnetic field received by the magnetoresistive element when an external magnetic field is applied was 1% or less, which implies an excellent shield effect. Meanwhile, for magnetic coupling type isolator having only the upper shield film 41, the percentage of the magnetic field received by the magnetoresistive element when an external magnetic field is applied was 10%, which implies a poor shield effect.

If the lower shield film 42 is disposed too close to the magnetoresistive elements R1 to R4, the magnetic field from the coil 2 may not be effectively applied to the magnetoresistive elements R1 to R4. If the lower shield film 42 is disposed too far from the magnetoresistive elements R1 to R4, the shield effect caused by the external magnetic field may not be generated. For this reason, in order to effectively apply the magnetic field from the coil 2 to the magnetoresistive elements R1 to R4 and promote the shield effect against the external magnetic field, it is necessary to appropriately set a distance between the lower shield film 42 and the magnetoresistive elements R1 to R4.

Figure 8:
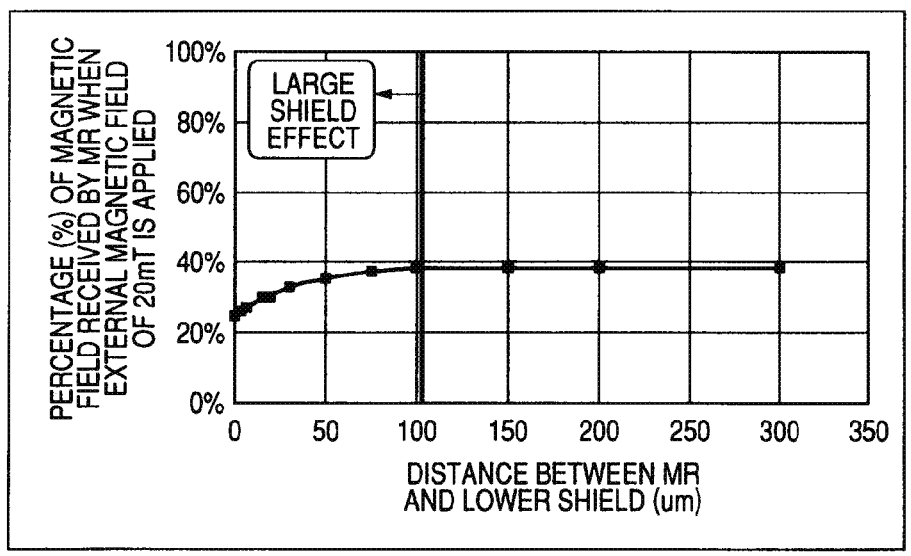
FIG. 8 shows a relationship between a distance between a lower shield film and a magnetoresistive element of a magnetic coupling type isolator and a percentage of the magnetic field received by the magnetoresistive element when an external magnetic field is applied.

Here, in the configuration including the upper and lower shield films 41 and 42 around the magnetoresistive elements R1 to R4, a percentage of the magnetic field received by the magnetoresistive element was examined when an external magnetic field of 20 mT is applied, in a direction of the arrow of FIG. 5 (the horizontal direction with respect to the magnetoresistive elements R1 to R4), to the magnetic coupling type isolator by changing the distance between the lower shield film 42 and the magnetoresistive elements R1 to R4 while maintaining the distance between the upper shield film 41 (lower end) and the magnetoresistive elements R1 to R4 at 17 μm. The result is shown in FIG. 8. As is apparent from FIG. 8, a higher shield effect can be exhibited by setting the distance between the lower shield film 42 and the magnetoresistive elements R1 to R4 to be equal to or lower than 100 μm.

In the configuration including the upper and lower shield films 41 and 42 around the magnetoresistive elements R1 to R4, the magnetic field received by the magnetoresistive elements R1 to R4 from the coil 2 was examined by changing the distance between the lower shield film 42 and the magnetoresistive elements R1 to R4 while maintaining the distance between the upper shield film 41 (lower end) and the magnetoresistive elements R1 to R4 at 17 μm. The result is shown in FIG. 9, in which the value represented in the ordinate is normalized to the maximum value.

Figure 9:
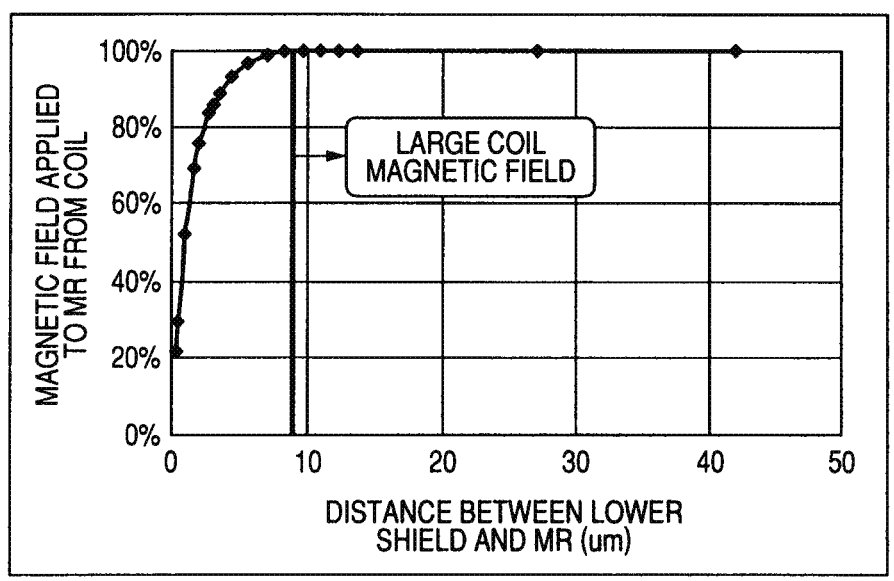
FIG. 9 shows a relationship between a distance between a lower shield film and a magnetoresistive element of a magnetic coupling type isolator and a magnetic field applied to the magnetoresistive element from a coil.

As is apparent from FIG. 9, when the distance between the lower shield film 42 and the magnetoresistive elements R1 to R4 is equal to or less than 8 μm, the effect that the lower shield film 42 absorbs the magnetic field from the coil 2 increases, so that the magnetic field may not be effectively applied to the magnetoresistive elements R1 to R4.

As described above, in the magnetic coupling type isolator according to an embodiment of the invention, the upper and lower shield films 41 and 42 are overlapped with the coil and the magnetoresistive elements R1 to R4 as seen in the top plan view, and the distance between the magnetoresistive elements R1 to R4 and the lower shield film 42 is set to 8 to 100 μm. As a result, it is possible to suppress the attenuation in the magnetic field applied from the coil 2 to the magnetoresistive elements R1 to R4 and increase the shield effect with respect to the external magnetic field.

The present invention is not limited to the aforementioned embodiment, but may be variously modified. For example, the material, the arrangement position of each layer, the thickness, the size, and the method of manufacturing of the aforementioned embodiment may be variously modified. In addition, the present invention may be variously modified without departing from the scope of the invention.

The present invention can be applied to an magnetic coupler, a current sensor, or the like.

It should be understood by those skilled in the art that various modifications, combinations, sub-combinations and alterations may occur depending on design requirements and other factors insofar as they are within the scope of the appended claims of the equivalents thereof.

What is claimed is:

1. A magnetic coupling type isolator comprising:
   a magnetic field generator for generating an external magnetic field by an input signal;
   a magnetoresistive element for detecting the external magnetic field and converting the detected magnetic field into an electric signal, the magnetoresistive element being electrically insulated from the magnetic field generator and positioned in a location capable of being magnetically coupled so as to be overlapped with the magnetic field generator as seen in a top plan view; and
   first and second shield films overlapped with the magnetic field generator and the magnetoresistive element as seen in a top plan view,
   wherein a distance between the magnetoresistive element and the second shield film is set to 8 to 100 μm.

2. The magnetic coupling type isolator according to claim 1,
- wherein the magnetic field generator includes first and second magnetic field generators by which the external magnetic field is generated in an opposite direction to each other, wherein the magnetoresistive element includes a magnetoresistive element disposed to face the first magnetic field generator and a magnetoresistive element disposed to face the second magnetic field generator,
- wherein each of magnetoresistive elements is included in the same layer, and
- wherein the magnetoresistive element disposed to face the first magnetic field generator and the magnetoresistive element disposed to face the second magnetic field generator constitute a bridge circuit.

3. The magnetic coupling type isolator according to claim 2, wherein the first shield film has a function of enhancing the magnetic field applied from the magnetic field generator to the bridge circuit.

4. The magnetic coupling type isolator according to claim 1, wherein the first and/or second shield films are made of a high magnetic permeability material.

5. The magnetic coupling type isolator according to claim 1, wherein the first and/or second shield films are point-symmetrical as seen in a top plan view, and symmetrical centers of the first and/or second shield films match with each other.

* * * * *